United States Patent
Maxwell et al.

(10) Patent No.: US 8,889,521 B1
(45) Date of Patent: Nov. 18, 2014

(54) METHOD FOR SILVER DEPOSITION FOR A NON-VOLATILE MEMORY DEVICE

(75) Inventors: Steven Patrick Maxwell, Sunnyvale, CA (US); Sung-Hyun Jo, Santa Clara, CA (US)

(73) Assignee: Crossbar, Inc., Sanata Clara, CA (US)

( * ) Notice: Subject to any disclaimer, the term of this patent is extended or adjusted under 35 U.S.C. 154(b) by 12 days.

(21) Appl. No.: 13/620,012

(22) Filed: Sep. 14, 2012

(51) Int. Cl.
*H01L 45/00* (2006.01)

(52) U.S. Cl.
CPC .................................. *H01L 45/16* (2013.01)
USPC .................. 438/382; 257/4; 257/E45.001

(58) Field of Classification Search
CPC . H01L 45/122; H01L 45/1233; H01L 45/124; H01L 45/1246; H01L 45/1253; H01L 45/126; H01L 45/1266; H01L 45/1273; H01L 45/16–45/1691
USPC ............. 257/1–8, 528–530, 536–543, 257/E45.001–E45.006; 438/382–385, 438/584–688
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |

(Continued)

FOREIGN PATENT DOCUMENTS

| | | |
|---|---|---|
| JP | 2005-506703 A | 3/2005 |
| JP | 2006-032951 A | 2/2006 |

(Continued)

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Steven J Fulk
*Assistant Examiner* — Eric Ward
(74) *Attorney, Agent, or Firm* — Ogawa P.C.

(57) ABSTRACT

A method of depositing a silver layer includes forming a plurality of openings in a dielectric layer to expose a top surface of a structure comprising a resistive memory layer on top of a p-doped silicon-containing layer on top of a conductive structure, depositing a first metal layer comprising a tungsten layer overlying the top surface of the structure, wherein a first metal material of the first metal layer contacts a resistive memory material of the resistive memory layer and exposing the first metal layer in a bath comprising a solution of silver species having an alkaline pH for a predetermined time to form a silver metal layer from the silver species from the solution overlying the resistive memory material, wherein the silver species is reduced by the first metal material, and wherein the first metal material is solubilized while forming the silver metal layer.

20 Claims, 4 Drawing Sheets

(56) References Cited

U.S. PATENT DOCUMENTS

| | | |
|---|---|---|
| 5,614,756 A | 3/1997 | Forouhi et al. |
| 5,645,628 A * | 7/1997 | Endo et al. .................. 106/1.23 |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 * | 7/2009 | Czubatyi et al. .............. 438/584 |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl et al. |
| 8,265,136 B2 | 9/2012 | Hong et al. |
| 8,374,018 B2 | 2/2013 | Lu |
| 8,385,100 B2 | 2/2013 | Kau et al. |
| 8,394,670 B2 | 3/2013 | Herner |
| 8,441,835 B2 | 5/2013 | Jo et al. |
| 8,467,227 B1 | 6/2013 | Jo |
| 8,587,989 B2 | 11/2013 | Manning et al. |
| 8,658,476 B1 | 2/2014 | Sun et al. |
| 8,659,003 B2 | 2/2014 | Herner et al. |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |

(56) References Cited

U.S. PATENT DOCUMENTS

| | | |
|---|---|---|
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1* | 1/2012 | Lu et al. ............................ 257/4 |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1* | 2/2012 | Herner et al. ..................... 257/4 |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1* | 9/2012 | Ohba et al. ................... 365/148 |
| 2012/0269275 A1 | 10/2012 | Hannuksela |
| 2012/0305874 A1 | 12/2012 | Herner |
| 2012/0326265 A1 | 12/2012 | Lai et al. |
| 2013/0020548 A1 | 1/2013 | Clark et al. |

FOREIGN PATENT DOCUMENTS

| | | |
|---|---|---|
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60,1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.

(56) References Cited

OTHER PUBLICATIONS

Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs. acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", 9th Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.

Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of $Cr/p^+$ a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.

(56) References Cited

OTHER PUBLICATIONS

Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Notice of Allowance for U.S. Appl. No. 12/814,410, dated Jan. 8, 2013.
Corrected Notice of Allowance for U.S. Appl. No. 12/861,666 dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Office Action of U.S. Appl. No. 13/436,714 dated Dec. 7, 2012.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 14/072,657, dated Jun. 17, 2014.

* cited by examiner

METHOD FOR SILVER DEPOSITION FOR A NON-VOLATILE MEMORY DEVICE

BACKGROUND

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magnetoresistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

SUMMARY OF THE PRESENT INVENTION

The present invention is directed to resistive switching device. More particularly, embodiments according to the present invention provide a device structure and a method to form a resistive switching device. The resistive switching device has been applied in non-volatile memory device. But it should be recognized that embodiment according to the present invention can have a much broader range of applicability In a specific embodiment, a method for forming a resistive switching device for a non-volatile memory device is provided. The method includes providing a substrate having a surface region. A first dielectric material is deposited overlying the surface region and a first wiring structure is formed overlying the first dielectric material. The method includes forming a junction material overlying the first wiring structure. In a specific embodiment, the method includes forming a resistive switching material overlying the junction material. The resistive switching material can be a silicon material having an intrinsic semiconductor characteristic in a specific embodiment. The method then subjects a stack material comprising at least the junction material and the resistive switching material to a first patterning and etching process to form a first structure. The first structure includes at least the junction material and the resistive switching material in a specific embodiment. The first structure further includes a surface region comprising a surface region of the resistive switching material. A second dielectric material is formed overlying the first structure and a thickness of second dielectric material overlying the first structure. In a specific embodiment, the method forms an opening structure in portions of the second dielectric material to expose a portion of the surface region of the resistive switching material. The method includes forming a catalytic material overlying at least the resistive material in a first portion of the opening structure and forming a silver material conformally overlying the resistive switching material in the opening structure from a solution. The solution includes at least a silver species in a reaction bath and characterized by an alkaline pH to cause the catalytic material to solubilize while forming the silver material. The method forms a second wiring structure overlying the silver material and exposed surface of the second dielectric material.

Many features are observed by ways of embodiments of the present invention over conventional techniques. For example, embodiments according to the present invention provide a method to form an active conductive material for a resistive switching device. The active conductive material can include noble metal such as silver, gold, palladium, platinum, and others which has a suitable diffusion characteristic in the resistive switching material caused by a presence of a suitable electric field. The present method of forming the active conductive material structure is free from a dry etch process (for example, reactive ion etching, or RIE), which is challenging, as the noble metals do not form a volatile species. Additionally, the present method can be realized using conventional processing equipments without modification. Depending on the embodiment, one or more of these benefits may be achieved. One skilled in the art would recognized other modifications, variations, and alternatives.

According to one aspect of the invention, a method for forming a non-volatile memory device is described. One technique includes depositing a first dielectric layer overlying a surface region of a substrate, forming a first wiring structure overlying the first dielectric material, forming a junction layer overlying the first wiring structure, and forming a resistive switching layer overlying the junction layer. One process includes subjecting a stack layer comprising at least the junction layer, the resistive switching layer to a first patterning and etching process to form a first structure comprising at least the junction layer and the resistive switching layer, the first structure comprising a surface region comprising a surface region of the resistive switching layer, forming a second dielectric layer overlying the first structure and forming a second dielectric layer overlying the first structure, wherein the second dielectric layer comprises a controlled thickness above the surface region, and forming an opening structure in portions of the second dielectric layer to expose a portion of the surface region of the resistive switching layer. One method includes forming a first metal layer comprising first metal material overlying at least the portion of the surface region of the resistive switching layer within a portion of the opening structure, forming a silver layer overlying at least the portion of the surface region of the resistive switching layer in the opening structure, wherein the silver layer is derived from a solution comprising at least a silver species in a reaction bath, wherein the solution comprises an alkaline pH to cause silver species of the solution to be reduced by the first metal material, and wherein the first metal layer is solubilized while forming the silver material, and forming a second wiring structure overlying the silver layer and an exposed surface of the second dielectric layer.

According to another aspect of the invention, a method of depositing a silver material layer is described. One process includes forming a plurality of openings in a dielectric layer to expose a top surface of a structure comprising a resistive memory layer on top of a p-doped silicon-containing layer on top of a conductive structure, and depositing a first metal layer comprising a tungsten layer overlying the top surface of the structure, wherein a first metal material of the first metal layer contacts a resistive memory material of the resistive memory layer. One technique includes exposing the first metal layer in a bath comprising a solution of silver species having an alkaline pH for a predetermined time to form a silver metal layer from the silver species from the solution overlying the resistive memory material, wherein the silver species is reduced by the first metal material, and wherein the first metal material is solubilized while forming the silver metal layer.

According to yet another aspect of the invention, a product manufactured according to any of the herein disclosed techniques is described.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

Embodiments according to the present invention are direct to resistive switching devices. More particularly, embodiments according to the present invention provide a method and a device structure for fabricating a resistive switching device. The resistive switching device has been used in a non-volatile memory device, but it should be recognized that embodiments according to the present invention can have a much broader range of applicability.

Resistive switching device exploits a unique property of electrical resistance change upon application of an electric field of certain non-conductive materials. A resistive switching device using a silicon material as the resistive switching material has an advantage of complete compatibility with current CMOS processing techniques. To change the resistance of the resistive switching material, a conductive material is provided in direct contact with the resistive switching material. The conductive material is characterized by a suitable diffusivity in the resistive switching material upon application of an appropriate electric field. Diffusion due to thermal effect or mass transfer should be insignificant compared to diffusion due to the electrical effect. The electric filed can be provided by applying a voltage or a current to the resistive switching device. For resistive switching device using silicon material as the resistive switching material, metal material such as silver, gold, palladium, platinum, aluminum, and others may be used. Silver material has the desirable diffusivity characteristic in amorphous silicon resistive switching material in presence of an electric field. Due to high mobility and surface characteristic of silver, deposition of silver onto a semiconductor surface and to fill a small area of opening can be challenging. Additionally, resistive ion etching of silver may not be possible due to lack of volatile species derived from silver. Accordingly, embodiments of the present invention provide a method and a device structure for a resistive switching device using amorphous silicon material as the resistive switching material and a silver material as an active conductive material.

Figure 1:
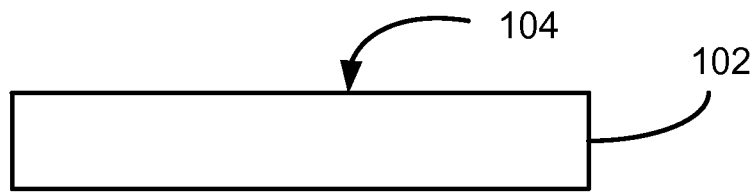
FIG. 1 is a simplified diagram illustrating a fabrication step according to various embodiments of the present invention.

As shown in FIG. 1, a semiconductor substrate 102 having a surface region 104 is provided. Semiconductor substrate 102 can be a single crystal silicon wafer, a silicon germanium material, a silicon on insulator (commonly called SOI) depending on the embodiment. In certain embodiments, semiconductor substrate 102 can have one or more MOS devices formed thereon or therein. The one or more MOS devices can be controlling circuitry for the resistive switching device, or the like in some embodiments.

In various embodiments, a processor, or the like, may include resistive memory memories as described herein. Because the resistive state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such resistive memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

Figure 2:
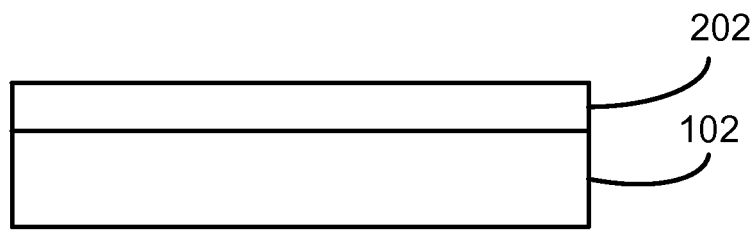
FIG. 2 is a simplified diagram illustrating a fabrication step according to various embodiments of the present invention.

As illustrated in FIG. 2, embodiments of the method include depositing a first dielectric material 202 overlying the semiconductor substrate 102. First dielectric material 202 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 202 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 3:
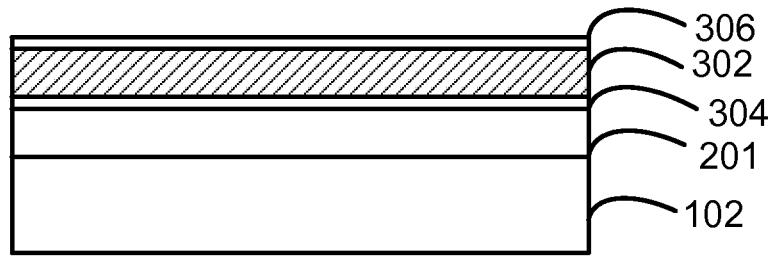
FIG. 3 is a simplified diagram illustrating a fabrication step according to various embodiments of the present invention.

Referring to FIG. 3, embodiments of the method include depositing a first wiring material 302 overlying the first dielectric material. First wiring material 302 can be a suitable metal material including alloy materials, or a semiconductor material having a suitable conductivity characteristic. In some embodiments, the metal material can be tungsten, aluminum, copper or silver, and others. In some embodiments, the first wiring material may be a combination of conductive materials. In various embodiments, these metal materials may be deposited using a physical vapor deposition process, chemical vapor deposition process, electroplating, or electrodeless deposition process, a combinations of these, and others. In some embodiments, the semiconductor material can be, for example, a p-type doped silicon material, a conductive polysilicon, or the like.

In certain embodiments, a first adhesion material 304 is first formed overlying the first dielectric material 302 before deposition of the first wiring material 302 to promote adhesion of the first wiring material 302 to the first dielectric material 202. A diffusion barrier material 306 may also be formed overlying the first wiring material 302 to prevent, for example, the conductive material, the metal material, gasses, oxygen, or the like to contaminate other portions of the device in a specific embodiment.

Figure 4:
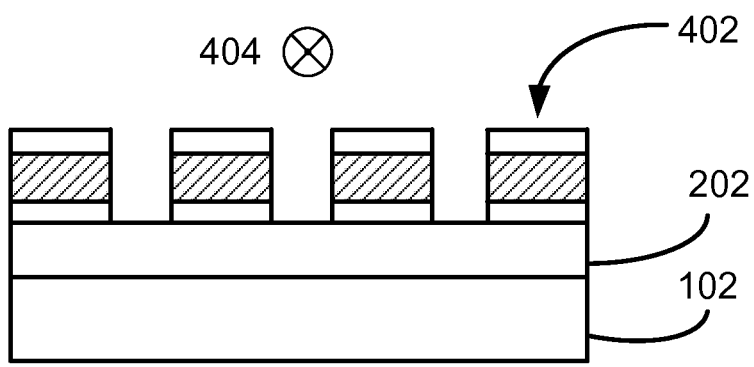
FIG. 4 is a simplified diagram illustrating a fabrication step according to various embodiments of the present invention.
Figure 5:
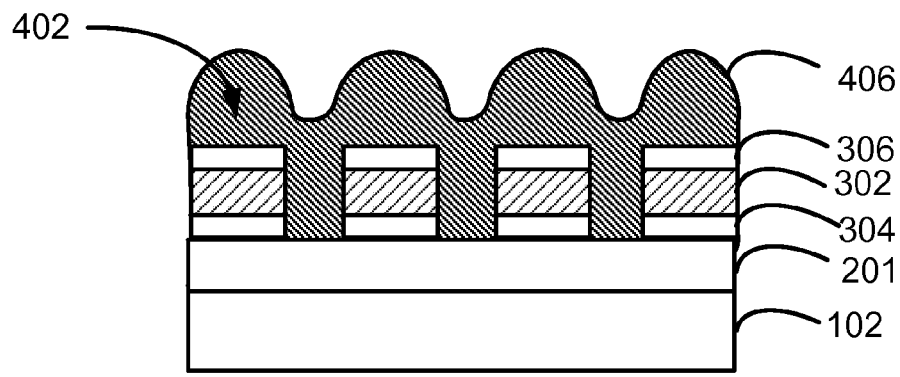
FIG. 5 is a simplified diagram illustrating a fabrication step according to various embodiments of the present invention.

In FIG. 4, an embodiment of the method subjects the first wiring material (302, 304 and 306) to a first pattern and etching process to form a first wiring structure 402 in a specific embodiment. As shown in FIG. 4, the first wiring structure 402 includes a plurality of first elongated structures configured to extend in a first direction 404 (into and out of the page) in a specific embodiment. In a specific embodiment, the method deposits a second dielectric material 406 overlying the first wiring structure, as illustrated in FIG. 5. The second dielectric material 406 can be silicon oxide, silicon nitride, a dielectric stack of alternating layers of silicon oxide and silicon nitride (for example, an ONO stack), a low K dielectric, a high K dielectric, or a combination, and others, depending on the application.

Figure 6:
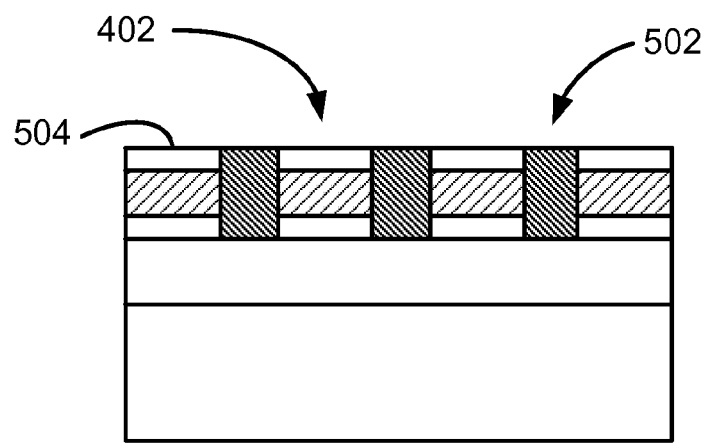
FIG. 6 is a simplified diagram illustrating a fabrication step according to various embodiments of the present invention.

As illustrated in FIG. 6, second dielectric material 406 can be subjected to a planarizing process to isolate the first wiring structures 402 in a specific embodiment. The planarizing process can be a chemical mechanical polishing process or an etch back process, a combination thereof, and others depending on the application. As shown in FIG. 6, a surface region 504 of the diffusion barrier material is exposed, and second dielectric material 406 remains in the spaces 502 between first wiring structure 402.

Figure 7:
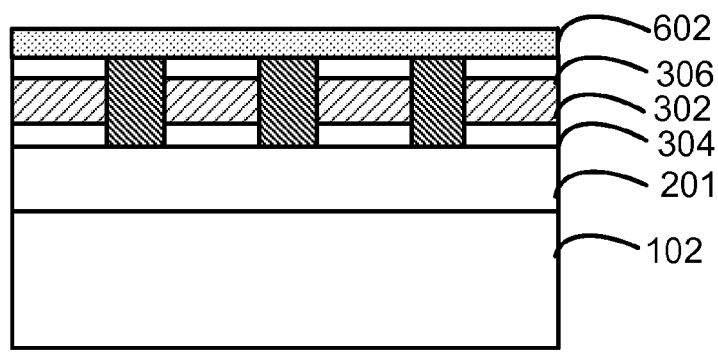
FIG. 7 is a simplified diagram illustrating a fabrication step according to various embodiments of the present invention.

Referring to FIG. 7, embodiments of the present invention includes a step of depositing a junction material 602 overlying the first wiring structure 402 and exposed surface region 504 of the second dielectric material 306. In various embodiments, junction material 602 can be a conductive p-doped silicon containing material, polycrystalline silicon material having a p+ impurity characteristic or a polycrystalline silicon germanium material having a p+ impurity characteristic, or a combination thereof. Junction material 602 can be deposited using techniques such as a chemical vapor deposition process including low pressure chemical vapor deposition process, plasma-enhanced chemical vapor deposition process, using silicon precursor such as silane ($SiH_4$), disilane ($Si_2H_6$), or a chlorosilane in a suitable reducing environment depending on the embodiment. Deposition temperature ranges from about 380 Degree Celsius to about 450 Degree Celsius and not greater than about 440 Degree Celsius depending on the application. Alternatively, junction material 602 can be deposited using a physical vapor deposition process from a suitable silicon target. In a specific embodiment, junction material 602 can be deposited using a low pressure chemical vapor deposition process using disilane at a deposition temperature ranging from about 400 Degree Celsius to about 460 Degree Celsius. In some embodiments, junction material 602 is configured to have the polycrystalline characteristic as deposited free from an anneal process.

Figure 8:
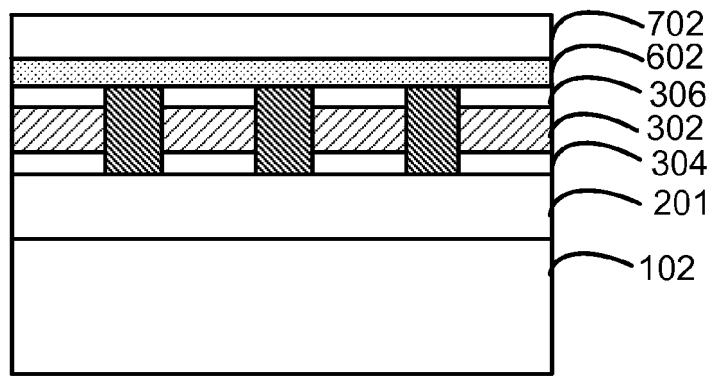
FIG. 8 is a simplified diagram illustrating a fabrication step according to various embodiments of the present invention.

Referring to FIG. 8, in some embodiments, the method deposits a resistive switching material 702 overlying junction material 602 (for example, the polycrystalline silicon having the p+ impurity characteristic). The resistive switching material 702 can include a suitable insulator material having a resistance that can be altered upon application of an electric field to the insulator material. In a specific embodiment, the resistive switching material 702 can include a silicon material. For example, the silicon material can be an amorphous silicon material, a microcrystalline silicon material, a macro crystalline silicon material, a silicon germanium material, a silicon oxide, and including any combination of these. In some embodiments, the silicon material includes an amorphous silicon material.

The resistive switching material 702 is characterized by a state, for example, a resistance state dependent on an electric field in the switching material. In a specific embodiment, the switching material 702 is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of polysilicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

In another embodiment, the resistive switching material/amorphous silicon material 702 may be formed from an upper region of a p+ polycrystalline silicon or p+ silicon germanium bearing layer (e.g. 602) using an Argon, Silicon, Oxygen plasma etch, or the like. For instance, a plasma etch may use a bias power within a range of approximately 30 watts to approximately 120 watts to convert an upper region of the polysilicon or silicon germanium material 602 into a non-conductive amorphous silicon 702 having p-type impurities (from the original polycrystalline silicon or silicon germanium bearing layer 602). In some embodiments, resistive e switching material 702 may be on the order of about 2 nm to about 5 nm.

Figure 9:
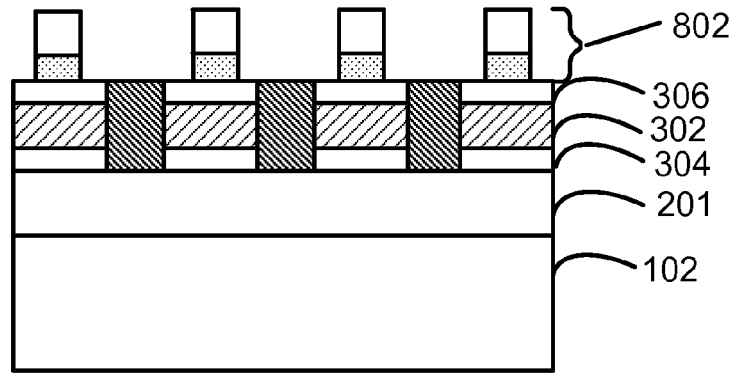
FIG. 9 is a simplified diagram illustrating a fabrication step according to various embodiments of the present invention.

In various embodiments, as illustrated in FIG. 9, resistive switching material 702 and junction material 602 are subjected to a patterning and etching process to form one or more first structures 802 substantially free from side wall contamination (e.g. silver). As shown, each of the one or more first structures comprises 802 includes at least resistive switching material 702 and junction material 602. In various embodiments, each of the one or more first structures 802 are configured to be in physical and electrical contact with first wiring structures 402.

Figure 10:
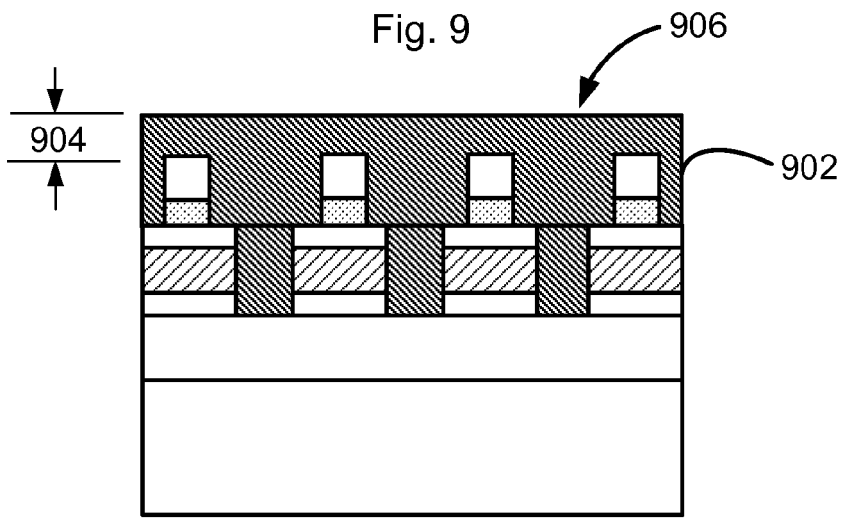
FIG. 10 is a simplified diagram illustrating a fabrication step according to various embodiments of the present invention.

Referring to FIG. 10, a third dielectric material 902 is formed overlying the first structures 802 to fill a gap 906 between each of the first structures 802. Third dielectric material 902 can include silicon oxide, silicon nitride, a dielectric stack of alternating layers of silicon oxide and silicon nitride (for example, an ONO stack), a low K dielectric, a high K dielectric, or a combination, and others, depending on the application. Third dielectric material 902 further forms a layer 904 having a controlled thickness overlying each of the first structures 802, as shown.

Figure 11:
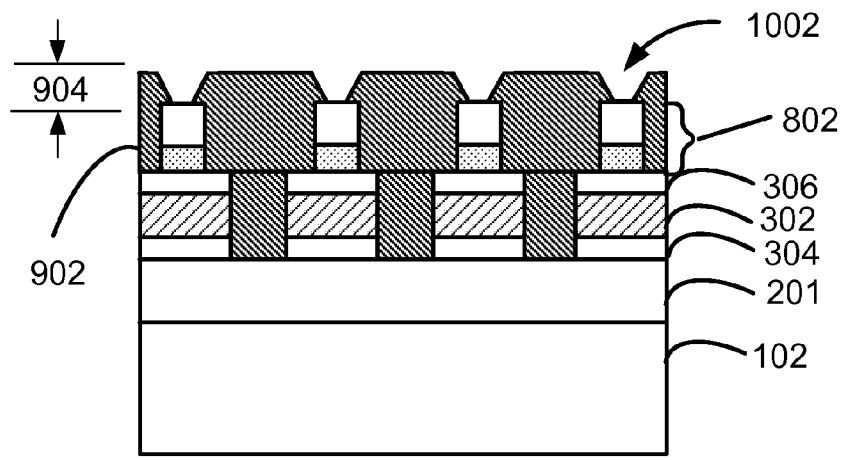
FIG. 11 is a simplified diagram illustrating a fabrication step according to various embodiments of the present invention.
Figure 12:
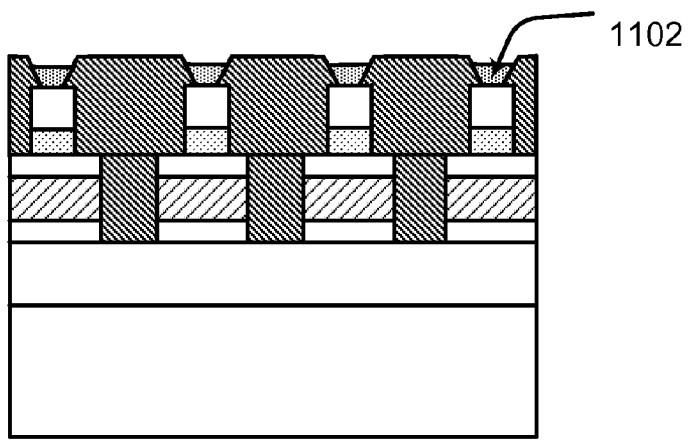
FIG. 12 is a simplified diagram illustrating a fabrication step according to various embodiments of the present invention.

Referring to FIG. 11, in various embodiments, the method include subjecting third dielectric material 902 to a patterning and etch process to form an opening structure 1002. As illustrated, opening structure 1002 in layer 904 of third dielectric material 902 overlies first structures 802. In various embodiments, opening structure 1002 exposes a top surface region of first structure 802, more specifically, a top surface region of resistive switching material 702, as shown. In other embodiments, the top surface region of the resistive switching material 702 may first be provided with a thin layer of titanium, or the like, that protects resistive switching material 702 during the following steps.

As illustrated in the example in FIG. 11, the method includes depositing an active conductive material 1102 at least in the opening structure 1002 overlying the resistive switching material 702 as shown in FIG. 11. In various embodiments, the active conductive material 1102 may be deposited using a physical vapor deposition process, a chemical vapor deposition process, an electrochemical (for example electroplating), and an electroless deposition process and others, depending on the application.

In a specific embodiment, active conductive material 1102 can be deposited overlying the resistive switching material 702 using an electroless deposition process. The electroless deposition process includes first forming a first metal material to promote formation of the active conductive material overlying the resistive switching material 702. For amorphous silicon material as the resistive switching material 702 and silver material as the active conductive material 1102, the first metal material can be cobalt, copper, tungsten, ruthenium, and others. These metal materials can be deposited using techniques such as a physical vapor deposition process, a chemical vapor deposition process, an electrochemical deposition process, and others.

In some specific embodiments, for amorphous silicon material as resistive switching material 702 and silver material as the desired active conductive material 1102, the first metal material can be tungsten. Tungsten has an additional advantage of having complete compatibility with conventional silicon processing. Depending on the application, tungsten can be deposited using techniques such as physical vapor deposition process, chemical vapor deposition process, or a combination, and others. In a specific embodiment, the deposited tungsten is characterized by a thickness ranging from about 30 Angstroms to about 100 Angstroms and has a good fill in the opening structures 1002. In some embodiments, the deposited tungsten can have a thickness of about 40 Angstroms to about 70 Angstroms.

In some embodiment, the method includes subjecting the first metal material, for example, the tungsten material, to a solution comprising an active metal species (e.g. silver) to form an active metal material (e.g. silver) overlying the resistive switching material 702. In operation, the active metal species (e.g. silver) in the solution is reduced by the first metal material (e.g. tungsten) in an electroless deposition process. For silver as the active metal material, the electroless deposition process includes providing a silver species in a solution in a reaction bath. In a specific embodiment, the silver species comprises a silver oxide material in a solution.

In specific embodiments, a solution including a silver species is provided by TechniSol® Silvermerse™ by Technic Inc., of Rhode Island, USA. The solution is characterized by a pH greater than about 7, that is, an alkaline pH, in a specific embodiment. In certain embodiments, the pH can range from about 7.5 to about 11. In other embodiments, the pH of the solution can range from about 8 to about 9.8. The alkaline pH may be provided using a potassium hydroxide solution, or others, depending on the application. In certain embodiment, thermal energy can be applied to the reaction bath including the solution comprising the silver species to provide for a deposition temperature ranging from about 35 Degree Celsius to about 70 Degree Celsius or about 40 Degree Celsius to about 60 Degree Celsius, or the like depending on the application.

In various embodiments, the silver oxide concentration can range from about 3 percent to about 4 percent, or the like. The silver concentration in the reaction bath can be adjusted using deionized water. In other embodiments, the silver concentration in the reaction bath can be adjusted using an ethylenediamine solution, also supplied by Technic Inc., of Rhode Island, USA. In various embodiments, the solution is further characterized by a suitable surface tension to allow for deposition in an opening structure having small areas. In various embodiments, the deposited silver can have a silver thickness depending substantially on a deposition time, silver oxide concentration, temperature, pH, or the like.

In some embodiments, the as-deposited silver is then subjected to a rinsing step using deionized water or other suitable solvent to remove residual reaction species, for example, silver oxide, potassium hydroxide, or ethyleneamine, and others. Depending on the application, silver material deposited on a top surface of the third dielectric material 902 can be removed using a chemical mechanical polishing process, a polishing step, or the like, while the silver material remains isolated in the opening structure 1002 and in electrical and physical contact with the resistive switching material 702 in a specific embodiment.

In a specific embodiment, the first metal material (e.g. tungsten) is consumed during active conductor material (e.g. silver) deposition. In the case of silver deposition, the tungsten material is consumed and a substantially pure silver material is formed. In one example, the silver material was deposited on a silicon material, using TechniSol® Silvermerse™ and tungsten (about 50 Angstrom) was used as the reducing material. Deposition parameters were as follows:

Provide a silicon substrate,

Deposit about 50 Angstroms of tungsten using a physical vapor deposition process from a tungsten target material, Provide a solution comprising a silver oxide material and a potassium hydroxide in a reaction bath, the silver oxide material has a concentration of about 3-4%) of silver oxide material, and the solution has a pH ranging from about 8-11.

Increase a temperature of the reaction bath ranging from about 40 Degree Celsius to about 60 Degree Celsius.

Immerse the silicon substrate including the tungsten material to the reaction bath comprises silver oxide material and potassium hydroxide solution for about 1 minute to about 15 minutes, Remove the silicon substrate having the silver material deposited from the reaction bath Subject at least the silver material to a rinsing process using deionized water.

Figure 13:
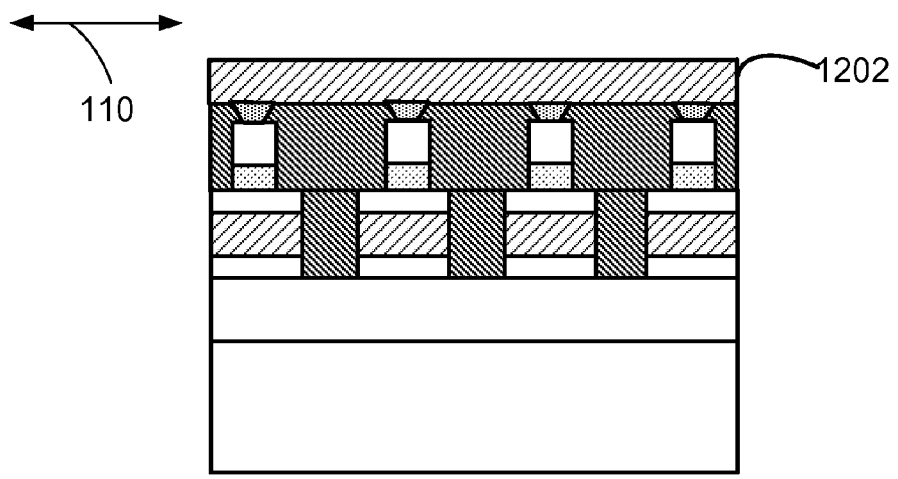
FIG. 13 is a simplified diagram illustrating a fabrication step according to various embodiments of the present invention.

In various embodiments, referring to FIG. 13, a second wiring material 1202 is formed overlying the third dielectric material 902 and contacting the silver in the opening structures 1002. The second wiring material can be tungsten, copper, aluminum, titanium, titanium oxide, or other suitable conductive material, depending on the application. The second wiring may be formed using a physical vapor deposition process, a chemical vapor deposition process, an electroplating process, an electroless deposition process, or a combination of theses, and others.

In various embodiments, the second wiring material 1202 is subjected to a patterning an etching process to form one or more second wiring structures. In various embodiments, the second wiring structure extends in direction 110, typically orthogonal to direction 440. Additionally, second wiring structure maintains a direct physical and electrical contact with the silver material in the opening structures, as shown. In some embodiments, the method continues to complete the device by forming isolating dielectric material and other passivation steps and others as would be recognized by one skilled in the art.

In various experiments described below, an electron microprobe analysis revealed that silver material deposited on a silicon substrate comprises about 97% silver and trace amount of oxygen, tungsten, and potassium.

Though the present invention has been exemplified in various embodiments, it is to be understood that the examples and embodiment described herein are for illustrative purpose only purposes only and that various modifications or alternatives in light thereof will be suggested to persons skilled in the art and are to be included within the spirit and purview of this application and scope of the appended claims.

What is claimed is:

1. A method for forming a non-volatile memory device, comprising:

depositing a first dielectric layer overlying a surface region of a substrate;

forming a first wiring structure overlying the first dielectric material;

forming a junction layer overlying the first wiring structure;

forming a resistive switching layer overlying the junction layer;

subjecting a stack layer comprising at least the junction layer, the resistive switching layer to a first patterning and etching process to form a first structure comprising at least the junction layer and the resistive switching layer, the first structure comprising a surface region comprising a surface region of the resistive switching layer;

forming a second dielectric layer overlying the first structure, wherein the second dielectric layer comprises a controlled thickness above the surface region;

forming an opening structure in portions of the second dielectric layer to expose a portion of the surface region of the resistive switching layer;

forming a first metal layer comprising first metal material overlying at least the portion of the surface region of the resistive switching layer within a portion of the opening structure;

forming a silver layer overlying at least the portion of the surface region of the resistive switching layer in the opening structure, wherein the silver layer is derived from a solution comprising at least a silver species in a reaction bath, wherein the solution comprises an alkaline pH to cause silver species of the solution to be reduced by the first metal material, and wherein the first metal layer is solubilized while forming the silver material, wherein the solution comprising the silver species comprises a silver oxide material, potassium hydroxide and water; and forming a second wiring structure overlying the silver layer and an exposed surface of the second dielectric layer.

2. The method of claim 1 wherein forming the silver layer further comprises providing thermal energy to the reaction bath to thereby increase a temperature of the reaction bath including the solution comprising at least the silver species to a temperature ranging from about 38 Degree Celsius to about 75 Degree Celsius.

3. The method of claim 1 wherein forming the silver layer is an electroless deposition process.

4. The method of claim 1 wherein the method further comprises forming a layer of titanium between the first metal layer and the portion of the surface region of the resistive swathing layer.

5. The method of claim 1 wherein the solution further comprising ethylenediamine.

6. The method of claim 1 wherein the junction layer is selected from a group consisting of: a p-doped polycrystalline silicon material, a p-doped polycrystalline silicon germanium material, a p+ doped silicon-containing material.

7. The method of claim 1 wherein the first metal material comprises a tungsten material deposited using a physical vapor deposition process at a deposition temperature ranges from about 25 Degree Celsius to about 30 Degree Celsius.

8. The method of claim 7 wherein the tungsten layer is characterized by a thickness ranging from about 30 Angstroms to about 100 Angstroms.

9. The method of claim 1 wherein the resistive switching layer is selected from a group consisting of: a silicon material having an intrinsic semiconductor characteristic, an undoped amorphous silicon material, a silicon and germanium material having an intrinsic semiconductor characteristic.

10. The method of claim 1 wherein the silver layer is substantially free from oxygen or tungsten or potassium.

11. The method of claim 1 wherein the substrate comprises a plurality of MOS devices formed therein.

12. A method of depositing a silver material layer comprising:

forming a plurality of openings in a dielectric layer to expose a top surface of a structure comprising a resistive memory layer on top of a p-doped silicon-containing layer on top of a conductive structure;

depositing a first metal layer comprising a tungsten layer overlying the top surface of the structure, wherein a first metal material of the first metal layer contacts a resistive memory material of the resistive memory layer; and exposing the first metal layer in a bath comprising a solution of silver species having an alkaline pH for a predetermined time to form a silver metal layer from the silver species from the solution overlying the resistive memory material, wherein the silver species is reduced by the first metal material, wherein the solution of silver species comprises silver oxide, potassium hydroxide, and water and wherein the first metal material is solubilized while forming the silver metal layer.

13. The method of claim 12 depositing the first metal layer comprises performing a deposition process selected from a group consisting of: a physical vapor deposition process, a chemical vapor deposition process, an electrochemical deposition process, an electroless deposition process.

14. The method of claim 12
wherein the method further comprises depositing a titanium layer overlying the top surface of the structure; and
wherein the depositing the first metal layer comprises depositing the first metal layer overlying the titanium layer overlying the top surface of the structure.

15. The method of claim 12 wherein the solution of silver species further ethylenediamine.

16. The method of claim 12 further comprising heating the solution of silver species to a temperature ranging from about 35 Degree Celsius to about 70 Degree Celsius.

17. The method of claim 12 wherein the alkaline pH comprises a pH value ranging from about 8 to about 11.

18. The method of claim 12 further comprises:
rinsing the silver metal layer using a deionized water to remove one or more residual material.

19. The method of claim 12 further comprising:
forming the resistive memory layer on top of the p-doped silicon-containing layer, wherein the resistive memory is selected from a group consisting of: a silicon material having an intrinsic semiconductor characteristic, an undoped amorphous silicon material, a silicon and germanium material having an intrinsic semiconductor characteristic.

20. The method of claim 12 further comprising:
forming the p-doped silicon-containing layer on top of a conductive structure, wherein the p-doped silicon-containing layer is selected from a group consisting of: a p-doped polycrystalline silicon material, a p-doped polycrystalline silicon germanium material, a p+ doped silicon-containing material.

* * * * *